United States Patent [19]

Cronin et al.

[11] 4,337,499

[45] Jun. 29, 1982

[54] ELECTRONIC ENCLOSURE AND ARTICULATED BACK PANEL FOR USE THEREIN

[75] Inventors: Michael J. Cronin, Sherman Oaks; David K. Elliot, Burbank, both of Calif.

[73] Assignee: Lockheed Corporation, Burbank, Calif.

[21] Appl. No.: 203,254

[22] Filed: Nov. 3, 1980

[51] Int. Cl.³ .............................................. H05K 7/20
[52] U.S. Cl. ....................................... 361/386; 339/4; 339/75 MP; 361/385; 361/413; 361/415
[58] Field of Search ....................... 174/52 R; 211/41; 339/4, 75 MP; 361/382, 385, 386, 388, 390, 395, 399, 398, 412, 415, 413

[56] References Cited

U.S. PATENT DOCUMENTS

| | | | |
|---|---|---|---|
| 3,631,325 | 12/1971 | Wenz | 361/415 |
| 3,950,058 | 4/1976 | Cronin | 339/75 M |
| 3,975,805 | 8/1976 | Spurling et al. | 211/41 |
| 4,214,799 | 7/1980 | Biche | 339/4 |
| 4,307,438 | 12/1981 | Grubb | 361/412 |

*Primary Examiner*—Gerald P. Tolin
*Attorney, Agent, or Firm*—Victor A. DiPalma

[57] ABSTRACT

A cabinet assembly or enclosure for printed circuit boards and the electronic components carried thereby which vary in depth as a result of the enclosed components and/or the space limitations in the area in which they are installed and in which the backplane is articulated to permit the automatic wiring thereof prior to assembly to the enclosure. The articulated backplane typically carries the terminals for interconnection to a wiring harness and has particular utility where such interconnections are through a wire program device desirably operable from the front of the cabinet. Thermal management for plural solid state power controllers or other heat generating components may also be achieved through the wire program.

15 Claims, 12 Drawing Figures

ELECTRONIC ENCLOSURE AND ARTICULATED BACK PANEL FOR USE THEREIN

TECHNICAL FIELD

This invention relates to the field of electronics and more particularly to a cabinet assembly or enclosure for printed circuit boards and the electronic components carried thereby. Such enclosures may vary in depth as a result of the enclosed components and/or the space limitations in the area in which they are installed. The backplane typically carries the terminals for interconnection to a wiring harness, desirably through a wire program device desirably operable from the front of the cabinet to provide a selectively changeable interface between the circuits within the cabinet and the external wiring harness.

The backplane of the cabinet assembly of the present invention is articulated to permit the automatic wiring thereof prior to assembly to the enclosure. Thermal management for plural solid state power controllers or other heat generating components may also be achieved through the wire program. Reference may be had to the Cronin patent application, Ser. No. 203,101, for "Electronic Circuit Board and Method and Apparatus For Thermal Management thereof" filed concurrently herewith and assigned to the assignee hereof for additional information on the relationship of this invention to the improved electronic enclosure and methods described and claimed therein.

BACKGROUND ART

Cabinets or enclosures for circuit boards are in common use in the electronics art and generally consist of a metal cabinet having a plurality of guides or racks for the circuit boards. The electrical switching or other components carried by the circuit boards generate heat. This heat tends to be concentrated in the area of the component and may be damaging to the component. To combat this problem, such cabinets generally utilize convective/forced air cooling of the printed circuit boards, and thus are usually susceptible to dirt build-up and to "hot spots" caused by the shielding or deflecting of the air flow by the components carried by the circuit boards.

The circuit boards may be of the printed circuit type and generally have terminations on one end of the circuit board. Electrical connection to an external circuit is generally established by the insertion of the board into a connector mounted on the rear wall of the cabinet with the circuit terminations on the end of the circuit board in pressural wiping contact with the terminals of the connector. Because the pressure necessary to insure good electrical contact is high in a high pin density environment, anything less than perfect alignment may be damaging to the connector or to the circuit boards.

Particular industries such as the aircraft, automotive, computer and others are moving toward solid state power switching and controlling. Such solid state power controllers (SSPC's) are the functional equivalent of a solid state relay, except that they incorporate over current and/or short circuit sensing circuitry coordinated with timing logic to protect the solid state power controller against self-destruction. As described in the Cronin U.S. Pat. No. 4,110,809, dated Aug. 29, 1978, and entitled "Solid State Power Controller With Low Signal Level Control," reaction to short time overloads is avoided to permit the voltage surges typically present in many electrical power systems. Typically, the drive/logic circuitry is contained in one electronic package or "can" and the power switching device is contained in a second "can." In many instances, it is desirable to locate a large number of the solid state power controllers in a particular location remote from the control station (such as the flight station of an aircraft) because of limited space, accessibility, etc.

As illustrated in the Cronin U.S. Pat. No. 3,950,058, dated Apr. 13, 1976, and entitled "Programmable Wiring System and Junction Box for Use Therein," it is possible to program or selectively change the interconnections of the control system to the remote SSPC's or electrical loads without disturbing the previously installed wiring harness. Since solid state power controllers are generally concentrated as to their location, and since they are heat sensitive, problems may arise as a result of the heat generated in these restrictive locations.

The installation of control circuits in limited spatial environments such as aircraft flight stations presents a continuing problem in the connection of remote or shipside wiring to the control circuits. The wire programming devices are typically of a significantly different depth than the printed circuit boards which contain the controllers. This variation in cabinet depth generally prevents the use of automatic wiring techniques which typically require a planar back panel to establish the wiring connections by "wire wrap" or "poke home" pins.

Other art relevant to this invention and the teachings of which are incorporated therein by reference, includes the Cronin U.S. Pat. No. 3,701,964, dated Oct. 31, 1972, and entitled "Flat Cable Electrical Wiring System" directed to a wire programmer and the Spurling U.S. Pat. No. 3,975,805 directed to special thermal clamps for circuit boards and the like.

DISCLOSURE OF INVENTION

The present invention is directed to a novel cabinet or enclosure assembly for solid state power controllers and/or other electronic devices.

In one aspect, the back panel of the cabinet assembly of the present invention is articulated so that it can be disposed in a single plane to facilitate the use of automatic electrical wiring equipment to provide the electrical connections between the circuit board pins on the back panel of the cabinet in one plane and the connector to the programmable wiring device carried by the back panel in another plane. A significant saving in time and money results from the use of automatic wiring equipment.

In another aspect, the cabinet assembly of the present invention uses zero insertion force (ZIF) connectors for electrically connecting each of the circuit boards to an internal circuit, for connecting the internal circuit to a wire programming device, and for connecting the wire programming device to an external circuit. Many of the pin damage and insecure mechanical and electrical connection problems are thereby obviated.

In another aspect, the present invention uses zero insertion force thermal clamps for connecting the circuit boards to cold plates within the cabinet, thus improving mechanical stability and thermal management of the electronic components.

In yet another aspect, the electrical connections between the circuit boards and the external circuit are programmable as a function of electrical and/or thermal considerations. Such wiring programming also permits two or more of the solid state power switches on the same or different circuit boards to be paralleled for greater current switching ability.

In still another aspect, thermal management is enhanced through the use of metal, e.g., aluminum, printed circuit boards which make thermal contact with cold plates that in turn are an integral part of a cabinet heat exchanger through which air or other fluid coolant is passed. Unlike "through the card" cooling, the coolant flow is not interrupted or by-passed around electronic components mounted on the circuit board. As a consequence, "hot spots" are reduced and the accumulation of "electronic dirt" on the components is avoided.

In another cabinet assembly design as exemplified by this invention, the interface of the printed circuit boards in the cabinet assembly is accomplished by allowing the circuit board connectors to mate directly with zero insertion force (ZIF) connectors which are physically mounted on a rigid backplane attached to the supporting structure. These ZIF connectors may be mechanically ganged together, so that a single shaft passing through the enclosure may be used to operate all ZIF connections simultaneously.

In still another aspect, the cabinet assembly of the present invention includes a novel circuit board for a solid state power controller and means for the thermal management of such boards.

In one aspect, a single choke and surge suppressor is utilized for a plurality of solid state power controllers on a circuit board thereby eliminating the need for such protection to be incorporated within each of the solid state power controllers. This results in a simplification of the controller design and a reduction in its cost.

In another aspect, thermal management of solid state power controllers is achieved by utilizing power controllers of the same current/power rating and by assigning them individually to external circuits through the selective connection of the external circuits to the circuit boards. Such selectivity on wire programming permits two or more power controllers, on the same or different circuit boards, to be paralleled for greater current-switching capability.

BEST MODE FOR CARRYING OUT THE INVENTION

Figure 1:
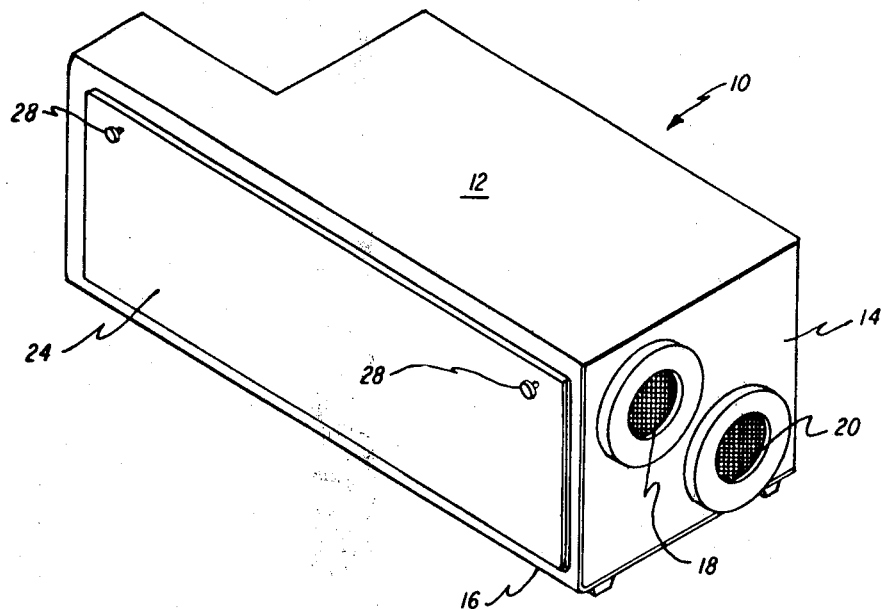
FIG. 1 is a pictorial view of one embodiment of an electronics enclosure in accordance with the present invention with the front panel closed.

The best mode for carrying out the invention is illustrated in the drawings where like reference numerals have been used to indicate like portions of the exemplary embodiment illustrated.

With reference to the embodiment illustrated in FIGS. 1-4, the cabinet 10 generally includes a top surface 12, a bottom surface (not shown), a right side panel 14, and a left side panel 32A, 32B as well as the cabinet front 16 and a back panel 54 hereinafter described in greater detail.

As shown in FIG. 1, the right side panel 14 may be provided with an inlet aperture 18 and outlet aperture 20 for a fluid coolant which passes through the cabinet from a remote heat exchanger (not shown), as will hereinafter be explained in greater detail. Alternatively, the cabinet may be provided with "muffin type" fans in push-pull configuration as depicted in FIG. 1.

Figure 3:
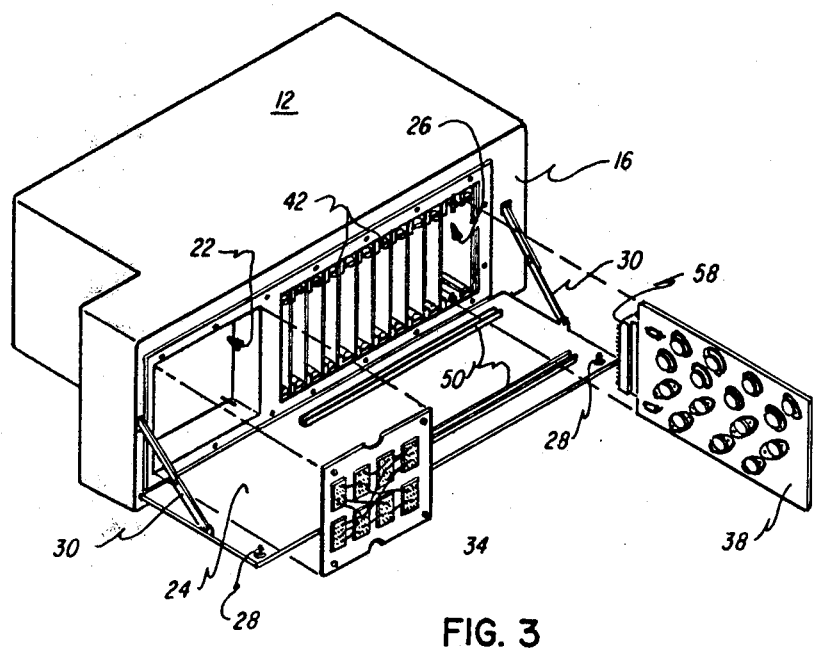
FIG. 3 is a pictorial view of the cabinet of FIG. 1 with the front panel open and showing the insertion of a wire program and a plurality of circuit boards.

With continued reference to FIG. 1, the front panel 16 may be provided with a door 24 hinged along the lower side thereof which may be opened as shown in FIG. 3 to provide access to the interior of the enclosure 10. One or more quick connect/disconnect latches 28 and hinged supports 30 of any suitable conventional type may be utilized to maintain the door 24 respectively in a closed position with respect to the front panel 16 as shown in FIG. 1 or in a predetermined open position as shown in FIG. 3.

As shown more clearly in FIG. 3, the cabinet front 16 has a window cut-out 22 to facilitate the insertion of a wire program or programmable matrix board 34. In addition, the cabinet front 16 may be provided with a large opening 26 into which a plurality of vertically disposed circuit boards may be inserted into the enclosure 10.

With continued reference to FIG. 3, the programmable matrix board 34 may be of the type disclosed and claimed in the Cronin U.S. Pat. No. 3,950,058 identified above. As shown more clearly in FIG. 4, this board 34 may provide a matrix of "poke through" pins arranged, on the internal circuit side, to mate with two zero insertion force connectors 60, 62 carried by the back panel 54B of the cabinet 10 for a "wire wrap" or other automatic wiring program electrical connection. On the left or external wiring wire harness side of the matrix board 34, the pins may be used to mate with ZIF connectors 68, 69.

Figure 9:
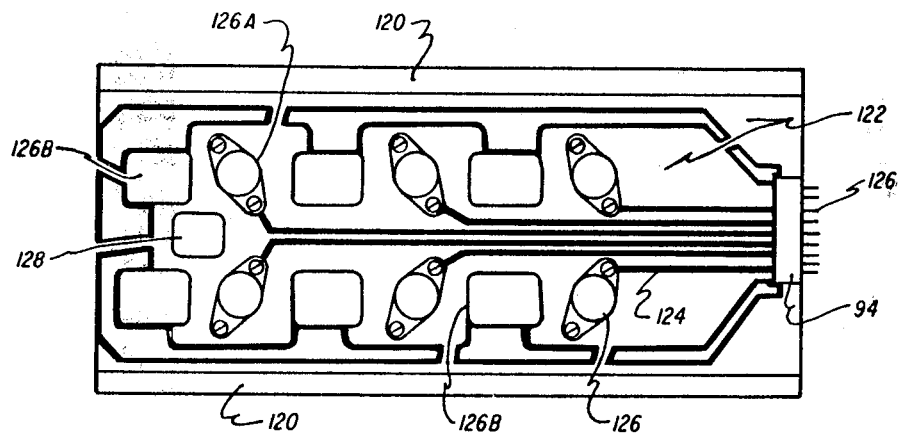
FIG. 9 is an elevation view of a printed circuit board containing components; a multiplicity of such boards are embodied within the enclosures of FIG. 1 and FIG. 5.

Each of the circuit boards 38 may be of the type illustrated in FIG. 9 and are insertable into the enclosure 10 through the opening 26 shown in FIG. 3 to mate with a zero insertion force connector (not shown in FIG. 3) carried by the back panel of the enclosure but operable from the front of the enclosure.

Figure 3A:
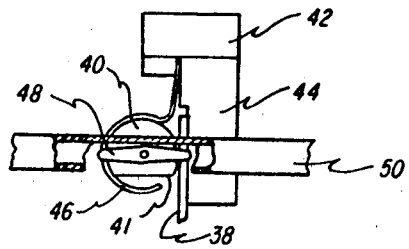
FIG. 3A is a pictorial elevation view in partial section illustrating the mechanical and thermal clamping of the printed circuit boards within the cabinet of FIG. 3, as well as the mechanical interlock of the clamps with the front panel to prevent the closing thereof in the absence of a secure mechanical and thermal clamp of each circuit board.
Figure 3B:
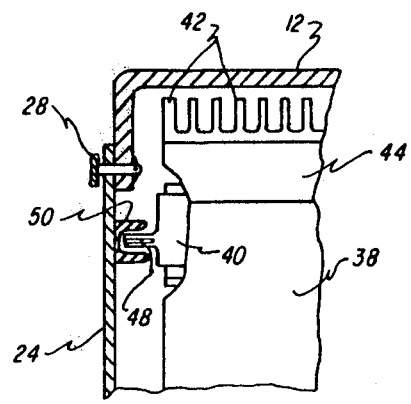
FIG. 3B is an elevation in partial section of the cabinet of FIG. 3 showing the interlock of FIG. 3A.

In addition to the electrical ZIF connection, each of the circuit boards 38 may be mechanically clamped along the upper and lower edges to the cabinet by means of a round key shaft 40 having a flat cam surface 41 as shown in more detail in FIG. 3A and FIG. 3B. The above described Spurling U.S. Pat. No. 3,975,805 may also be referenced.

With reference to FIG. 3, the heat exchanger fins 42, preferably of aluminum, may be extruded or attached by brazing to cold plates 44 located at the top and bottom of the cabinet. The key shaft 40 is retained by a semispherical spring sleeve 46, desirably of beryllium-copper, and may be rotated by means of a handle 48 to clamp the circuit board securely against the cold plate 44.

As shown in FIGS. 3A and 3B, the handle 48 may provide a mechanical interlock with a channel member 50 carried by the door 24 on the inside thereof. In this way, it is not possible to fully close the front panel unless proper clamping of all circuit boards has been effected.

Where the key shafts 40 extend the depth of the enclosure and/or are otherwise used to operate the electrical ZIF connector for that cicuit board, the manual rotation of a key shaft at the top and bottom of the board will provide both mechanical and electrical connection of the circuit boards 38 to the enclosure 10.

As explained below in greater detail in connection with the embodiment illustrated in FIGS. 5-8, electrical ZIF's may be ganged and operated simultaneously from the front of the panel front 16 independently of the mechanical clamps.

One alternative to the use of the cold plates 44 and fins 42 as described above is to omit the cold plates 44 and to blow air or other fluid in one of the aperatures 18, 20 in the end panel 14 of FIG. 1, vertically between circuit boards 38 to achieve the cooling thereof, and out of the other aperature 18, 20.

Figure 2:
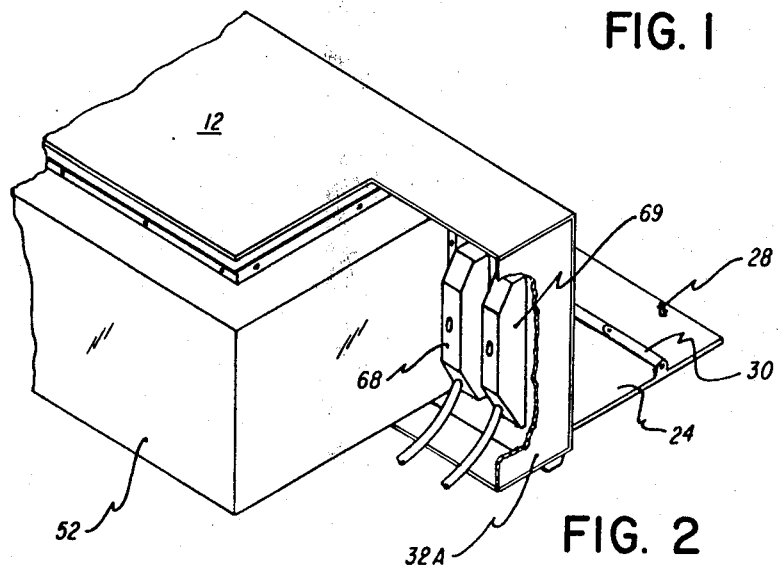
FIG. 2 is a pictorial view of the left side of the cabinet of FIG. 1 showing the connectors from the external electrical circuits.
Figure 4:
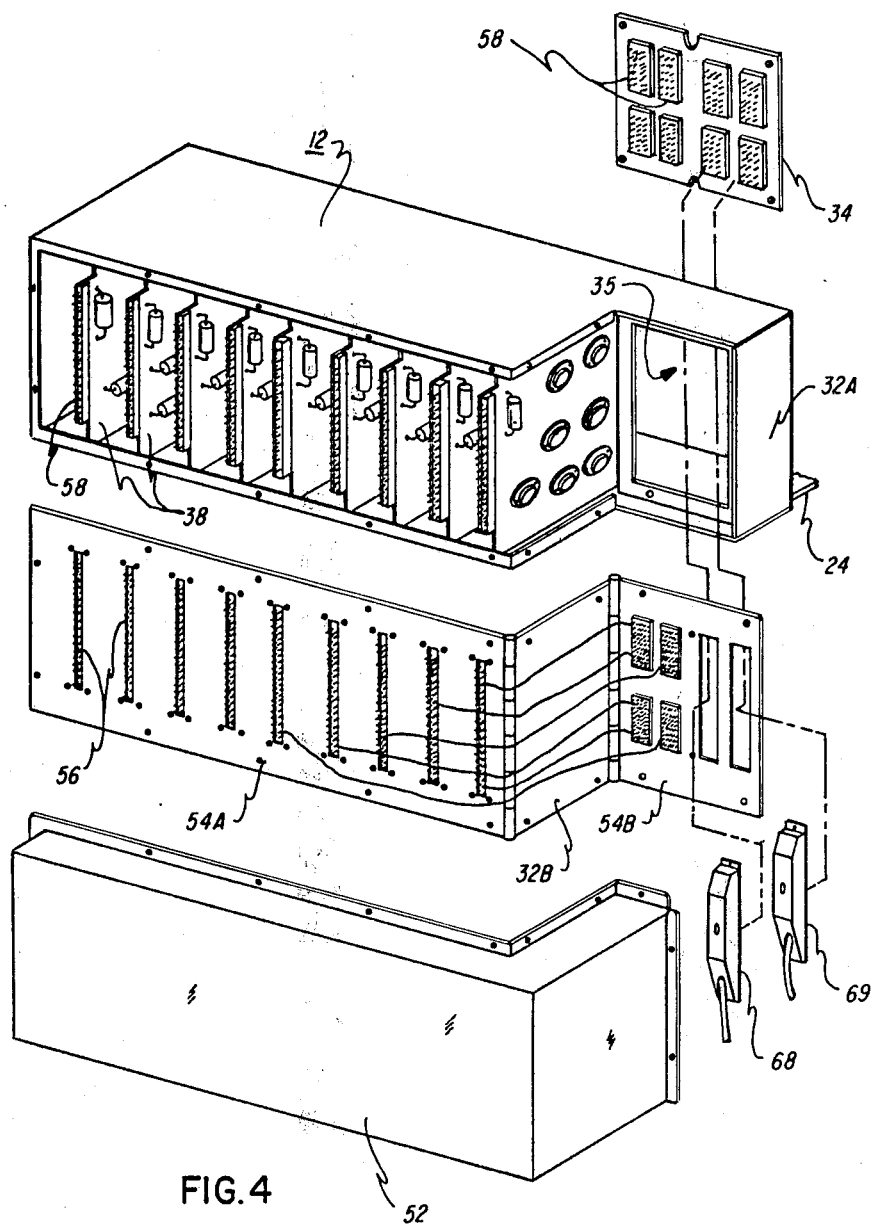
FIG. 4 is an exploded view of the rear of the cabinet of FIG. 1 showing the assembly thereof.

With reference to FIG. 2, and with reference to the exploded view of FIG. 4, the wire program board 34 may be inserted into the opening 22 in the panel front 16 so that the pins thereof are accessible through the window 35 in the forward portion 54B of the back panel. This conveniently permits movement of the wire programming board 34 forward in the cabinet and thus provides front panel access for easy insertion and removal.

With reference again to FIG. 4 where the rear of the cabinet has been exploded to illustrate the construction thereof, the cabinet 10 is desirably constructed so that the rear cover plate 52 is removably attached thereto by means of suitable conventional fasteners (not shown). The articulated back panel 54 may also be removably connected to the enclosure by means of suitable conventional fasteners (not shown).

As shown in FIG. 4, the back panel 54 includes a rear section 54A hingedly connected to the side panel 32B which is in turn hingedly connected to a forward portion 54B of the rear panel. The rearmost section 54A of the rear panel is desirably provided with a plurality of vertically-mounted zero insertion force (ZIF) female connectors 56 of any suitable conventional type adapted to mate with the connectors 58 of the printed circuit boards 38 of FIG. 3 upon the insertion thereof into the cabinet. The rearward facing side of the ZIF connectors 56 provide a plurality of wire wrap pins or other electrical terminals to permit automatic wiring.

The forward section 54B of the articulated rear panel 54 carries two ZIF connectors with rearwardly extending wire wrap pins. The forward section 54B of the back panel may also be provided with apertures 66 to receive the two ZIF wiring connectors 68 and 69 of the wiring harness. The front facing sides of the two "internal wiring" ZIF connectors and the two "external wiring" ZIF connectors 68, 69 have forward facing female contacts to cooperate with the pins of the insertable/removable wire programmable matrix board 34 of FIG. 4. As discussed above, the matrix board may have a connector having one pin "poked through" an aperture in the right hand side of the matrix board 34 into one of the "internal wiring" connectors and having a second pin which is connected to the first pin with a wire, "poked through" one of the apertures in the left hand side of the matrix board 34 into one of the "external wiring" connectors 68, 69 to provide a selectively changeable circuit interface. Thus, the wire program may be implemented from the front of the cabinet front 16.

A cover plate 52 is desirably provided to cover the exposed wire wrapped pins on the rear surface of the articulated back panel.

With continued reference to FIG. 4, the back panel 54A may be removed from the enclosure and placed in a single plane for automatic wiring. In this flat position, the pins of the ZIF connector 56 to which the circuit boards 38 are to be attached may be wire-wrapped connected to the pins of the ZIF connectors. Sufficient wire length must, of course, be provided to permit the articulation of the back panel as shown in FIG. 3 for attachment to the enclosure 10. Other suitable conventional automatic techniques for automatic or machine wiring, such as that known as "Flexpoint," may be used.

As thus described, the articulated back panel's ZIF's may be automatically wired at a substantial reduction in expense and the circuits carried by the circuit boards thereby connected to the internal wiring ZIF connectors 60, 62 of the wire programming device. The wire program board 34 may also be connected to the "external wiring" connectors 68, 69. Thus all connections may thus be of the zero insertion force type to reduce the possibility of damage due to the large mechanical insert force inherent in the use of wiping contacts in high pin density connectors.

Figure 5:
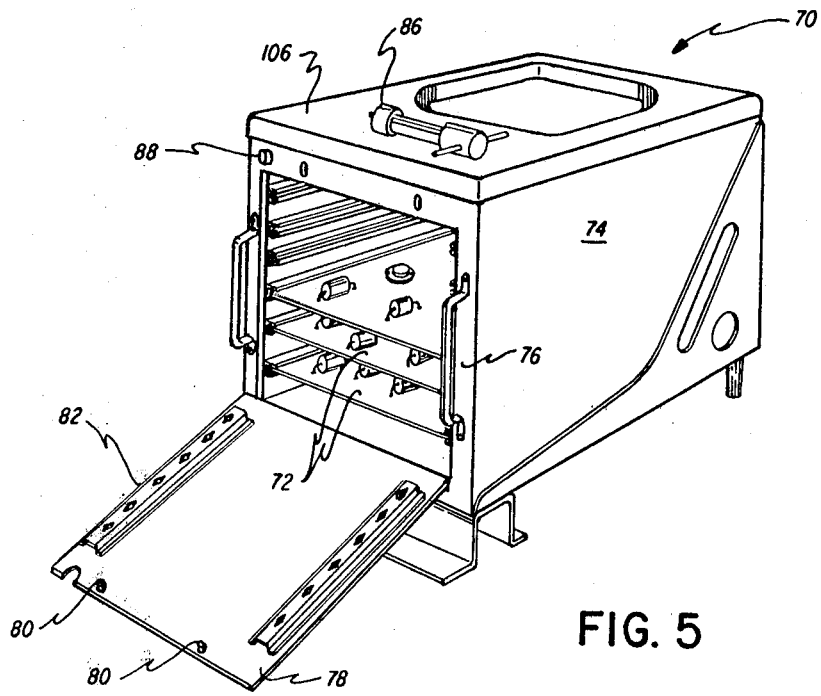
FIG. 5 is a pictorial view of a second embodiment of the cabinet of the present invention with the front panel open.

A second embodiment of the cabinet of the present invention is illustrated in FIGS. 5-8. With reference to FIG. 5, a plurality of circuit boards of the type hereinafter illustrated in greater detail in connection with FIG. 9 may be mounted in an avionics assembly or cabinet 70 adapted for insertion in a multi-shelf cabinet which includes a heat exchange system such as refrigerated air.

As shown in FIG. 5, the cabinet 70 may comprise upright side walls 74 (with or without fins through which a coolant may pass) and a front wall 76 to which a coverplate 78 may be hingedly connected. As in the embodiment of FIG. 1, any suitable conventional supports such as the type of support 30 illustrated in FIG. 3 may be used to maintain the coverplate 78 in a predetermined open position. Likewise, any suitable conventional quick connect/disconnect fasteners 80 may be utilized to hold the coverplate 78 in a closed position with respect to the front wall 76 of the cabinet 70.

With continued reference to FIG. 5, a number of such printed circuit boards 72, such as the six illustrated, may be horizontally carried in a vertical stack within the cabinet 70. The inside of the coverplate 78 may be provided with mechanical interlock means 82 for insuring the mechanical and thermal clamping of the printed circuit boards 72 into the cabinet 70 as a necessary condition precedent to the complete closure of the coverplate 78. This interlock may be of the U-shaped channel-type described in connection with FIGS. 3A and 3B, or may alternatively be shaped such as illustrated in FIG. 5 to conform generally to the handles of the operating means for the printed circuit board clamping mechanism.

Figure 6:
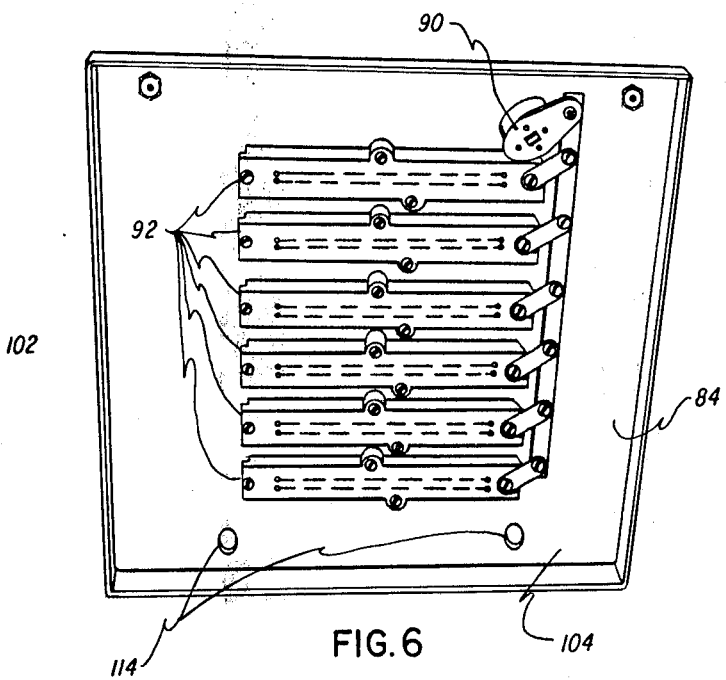
FIG. 6 is a rear elevation view in partial section illustrating the operation of the ganged zero insertion force electrical connectors of FIG. 7 from the rear to front of the cabinet by the key illustrated in FIG. 5.

The electrical ZIF connectors carried by the rear panel 84 may be ganged together as shown in FIG. 6 for operation by means of the insertion of a hand held key 86 over a rotatable shaft 88 extending from the enclosure. These female ZIF connectors receive the metal printed circuit boards 72.

As illustrated in FIG. 6, the shaft 88 of FIG. 5 may be used to rotate a master lever 90 which in turn operates each of the ZIF connectors 92 to establish electrical contact with the male connectors 94 mounted on each of the printed circuit boards 72.

Figure 7:
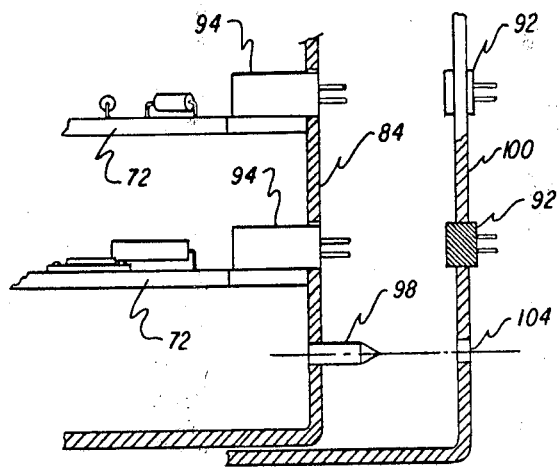
FIG. 7 is an elevation view in partial section of the lower rear portion of the cabinet of FIG. 5 showing the mass connections to a backplane which forms part of the supporting structure.

The ZIF connectors 92 may incorporate wire wrap pins which extend rearwardly therefrom for mating with individual ZIF connectors terminating in interfacing flat cables of the shipside or external wiring harness. To insure pin alignment, a tapered indexing pin 98 such as illustrated in FIG. 7 may be used to align the enclosures with a rigid back plane 100 carried by the enclosure supporting structure.

Figure 8:
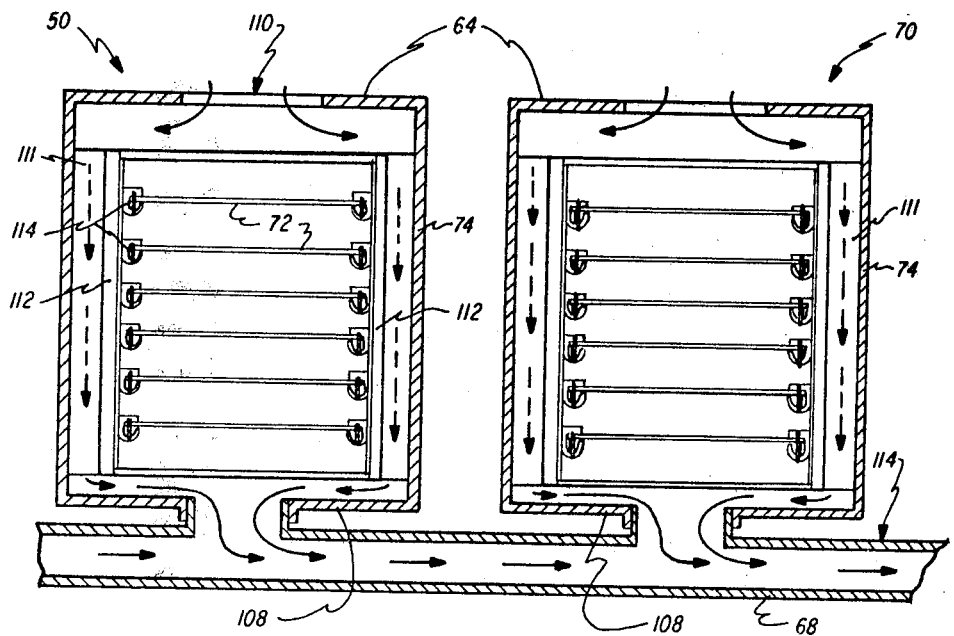
FIG. 8 is an elevational view in cross-section of two of the cabinets of the type illustrated in FIG. 5 in place on a support structure which serves as a conduit for a fluid coolant.

With reference again to FIG. 5, and to FIG. 8, the top 106 and the bottom 108 of the cabinet 70 may be apertured for the passage of a fluid coolant. As shown in FIG. 8, the bottom 108 of the cabinet 70 may be apertured to mate with a hollow shelf or other means which serves both to mechanically support one or more of the cabinets 70 and also to provide a channel for a fluid coolant. Thus, as illustrated in FIG. 8, a coolant may enter the aperture 110 in the top 106 of the cabinets 70 and flow downwardly through the heat exchanger fins 111 of the cold plates 112, and out through the aperture in the bottom 108 of the cabinet 70 into the shelf 114 for return to the remote coolant source (not shown). The fins 111 may be integral with the cold walls (e.g., formed by casting or extrusion) or attached thereto (e.g., by brazing), and may be of any suitable material, such as aluminum.

While not shown in great detail in FIGS. 5 and 6, the mechanical clamps 114 may be of the type illustrated in FIG. 3 to mechanically secure the circuit boards 72 and to provide a positive conductive cooling path to the cold plates 112.

Figure 10:
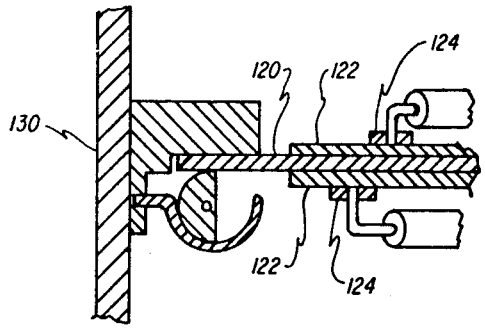
FIG. 10 is a front view of the thermal and mechanical interlock mechanism of the front panel of the embodiment of FIG. 5.

To facilitate the conductive cooling of the present invention, a novel circuit board is provided. With reference to FIGS. 9 and 10, the circuit board of the present invention includes a generally rectangular flat plate 120 of a heat conductive metal such as aluminum on which a moderately thermally heat conductive but electrically insulative material 122 has been placed by a suitable conventional technique leaving the edges of the flat metal plate 120 exposed for thermal connection to the cabinet as will be subsequently explained. The insulating base may then be provided with a printed circuit by any suitable conventional technique such as metal deposition and chemical etching.

With continued reference to FIGS. 9 and 10, the circuit board of the present invention may be provided at one end with a suitable conventional in-line zero insertion force (ZIF) male connector 94 having, as shown in the embodiment illustrated, a number of pins 126 extending therefrom for interface with a female ZIF connector 92 such as shown in FIGS. 6 and 7. The insulative material 122 may support a number of circuit traces 124 which terminate in the connector 94 at one end and to a solid state power controller 126 at the other end. In the illustrated embodiment, the source of power external to the circuit board is electrically connected through a choke and surge suppressor circuit 128 carried by the circuit board to each of the six power controllers 126. Each power controller 126 may include two cans, i.e., an electronic power switch can 126A and a logic can 126B providing the drive/logic circuitry for the controller. In the FIG. 9 configuration, four electronic (T03) cans and four flat-pack devices are illustrated whereas eight T03 cans are shown in FIG. 3.

A small amount of power is dissipated in the control and drive circuitry so the devices 126B may dissipate 2 watts each, while the T03 can (power controller) 126A may dissipate 12.5 watts at, for example, 10 amps. Therefore, if the total power dissipation per power controller in the FIG. 9 configuration is approximately 14.5 watts, a total power dissipation on one board of 116.0 watts would result if eight 10 amp loads were connected to that one board. Where the circuit board is designed to dissipate only approximately 55 watts, thermal overloading will result. By use of the wire program, some of the 10 amp loads may be transferred to other circuit boards. An illustrative example may be understood by reference to FIG. 11 where two circuit boards 140 and 142 are schematically illustrated as having six solid state power controllers 144. These solid state power controllers 144 are schematically illustrated as being connected to output terminals A-F on circuit board 140 and to output terminals G-L on circuit board 142. The power controllers 144 of the circuit boards 140 and 142 all may be of the identical current rating, whose full load power dissipation may be, for example 14.5 watts at 10 amps.

Figure 11:
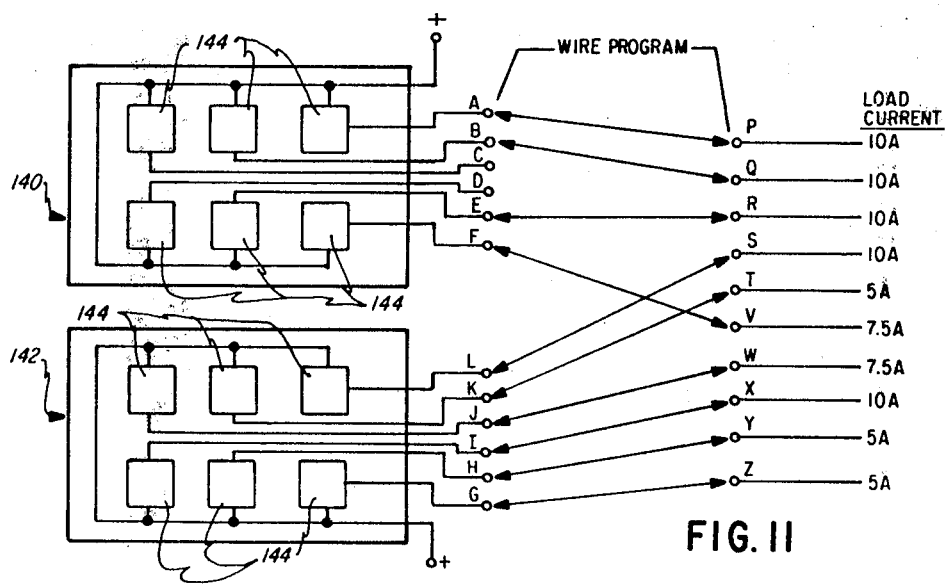
FIG. 11 is a schematic illustration of the use of a wire program device for thermal and electrical load balancing.

With continued reference to FIG. 11, ten external circuits are illustrated with current requirements set out in association therewith. All five of the 10 amp circuits could be connected to circuit board 140, while the remaining 5 amp and 7.5 amp loads could be connected to circuit board 142. The result of such an electrical interface with the external loads P through Z, is that circuit board 140 would be running in an overtemperature condition, while board 142 was running in an under temperature condition.

However, by a joining of this patent with the teachings of the Cronin U.S. Pat. No. 3,950,088 dated Apr. 13, 1976, it is possible to freely control and adjust the interface of the power controller terminals A-F and G-L, with the external load circuits P-Z by means of the insertable/removable wire program board 34 of FIG. 3. Such a wire program as illustrated in FIG. 11 may be an integral part of a power controller cabinet assembly, as described in connection with the embodiment illustrated in FIG. 1-4 or, it may be separate from but located adjacent to a controller assembly as shown in FIG. 11. In either configuration, it will readily be seen that it is possible to equalize the heat dissipation of a plurality of boards by the connection illustrated in FIG. 11 where each circuit board must be limited to 55 watts of power dissipation.

This thermal redistribution can be effected, via the wire-program, without any change to the wire harnesses supplying the power controller cabinet assemblies. Such thermal management can be controlled to spread the heat around a single circuit board as well as to spread the heat among the various circuit boards.

It should be noted that the power controllers have one current-rating, e.g. 10 amperes at 28 VDC, but they may be actually used in circuits having current levels between 1 and 10 amps. The advantages of this are that inventory-stocking and logistic support aspects, are improved in that a single size power controllers may be used in a number of different current capacity circuits. As an example, 85% of all circuits in a typical aircraft may be below 10 amps, so the same 10 ampere solid state power controller can be used for all these loads. The other 15% of the circuits may be paralleled on one board or different boards for higher current without distributing or changing the wiring harnesses supplying the cabinet.

INDUSTRIAL APPLICABILITY

The electronic cabinet of the present invention has particular applicability in the aircraft, automotive, computer and other industries where solid state power switching and control devices are employed. For example, the aerospace industry uses large numbers of solid state power controllers with over current and/or short circuit sensing circuitry such as described in the Cronin U.S. Pat. No. 4,110,809, dated Aug. 29, 1978. Such devices have junctions which have very low electrothermal time constants and are therefore subject to failure as a result of any overheating. The present invention has particular applicability where space limitations or other reasons make it desirable to concentrate the power controllers in a single location. In addition, it is desirable to have the flexibility of selectively interconnecting the external aircraft circuits to various ones of the circuit boards, as well as to have the capacity for prompt replacement of a single circuit board. The stocking of power controller of one size significantly reduces inventory problems.

The advantages of mass production techniques in the wiring of the circuit boards to the shipboard circuits by means of articulation of the back panels and the use of wire programming devices, are obvious where the space available for electronic equipment may be severely limited and/or of different depth. Moreover, the mechanical and electrical connecting/disconnecting of the printed circuit boards from the front of the panel is very important in the restricted space of an aircraft flight station or the like.

While the foregoing explanation illustrates the best mode known to the applicant of implementing the invention, many modifications will be apparent to one skilled in the art, and the foregoing is to be construed only as exemplary and not limiting, with the scope of the invention determined by reference to the following claims.

We claim:

1. Programmable electronic enclosure comprising:
   a three dimensional enclosure having a front panel and a removable back panel disposed in at least two planes generally parallel to each other and to the front panel;
   a first portion of said back panel in a first one of said at least two planes including a plurality of terminals each adapted on the front side thereof for electrical connection to circuit boards inserted into the enclosure through the front panel, each of the plurality of terminals being adapted to be wired on the back side thereof by automatic wiring means;
   a second portion of said back panel in a second one of said at least two planes including a connector adapted to be wired on the back side thereof by automatic wiring means;
   said two portions of said back panel being pivotably connected to opposite ends of a side panel of the enclosure whereby both of the portions of said back panel and the pivotably connected side panel may be disposed in a single plane when removed from the enclosure to facilitate wiring of said plurality of terminals to said connector by automatic wiring means and thereafter articulated for attachment to said enclosure.

2. The enclosure of claim 1 wherein said enclosure includes two electrical connectors and programmable means for selectively interconnecting the terminals of said two connectors, said programmable interconnecting means and said two connectors being carried by said enclosure between said front panel and said second portion of said back panel, one of said connectors being adapted to mate with the connector of said back panel and the other of said connectors being adapted to mate with a connector for wiring external of the enclosure.

3. The enclosure of claim 2 wherein said two connectors are zero insertion force connectors operable from the front of the enclosure.

4. The enclosure of claim 3 wherein said circuit boards include a conductive heat transfer means; and wherein said enclosure includes cold plate means for thermally connecting the conductive heat transfer means of said circuit boards.

5. The enclosure of claim 4 including fluid coolant channel means internal thereof and adapted to be connected to a heat exchanger external of the enclosure.

6. The enclosure of claim 4 wherein said thermal connecting means includes a clamp of the zero insertion force type.

7. The enclosure of claim 6 wherein said back panel includes a zero insertion force connector operable from the front of the enclosure for electrically interconnecting said circuit boards to said terminals.

8. The enclosure of claim 7 including means for simultaneously operating the zero insertion force electrical connectors of said circuit boards.

9. The enclosure of claim 8 including means for circulating a cooling fluid in thermal communication with the heat transfer means of said circuit boards, while maintaining electrical isolation from the electrical components carried by said circuit boards.

10. The enclosure of claim 1 wherein said circuit boards include a conductive heat transfer means; and wherein said enclosure includes means for thermally connecting the heat transfer means of said circuit boards.

11. The enclosure of claim 10 wherein said circuit boards include one or more heat sinks; and
    including means for circulating a cooling fluid in thermal communication with said heat sinks of said circuit boards, while maintaining electrical isolation from the electrical components carried by said circuit boards.

12. The enclosure of claim 11 wherein said thermal connection means includes a clamp of the zero insertion force type.

13. The enclosure of claim 1 wherein said back panel includes a zero insertion force electrical connector operable from the front of the enclosure for electrically connecting said circuit boards to said terminals.

14. The enclosure of claim 13 wherein said zero insertion force electrical connector is operable to electrically connect all of said circuit boards to said terminals simultaneously.

15. The enclosure of claim 14 wherein each of said circuit boards include a heat transfer means; and
wherein said enclosure includes cold plate means for thermally connecting the heat transfer means of said circuit boards, said thermal connecting means including a zero insertion force connector.

* * * * *